(12) United States Patent
Mandyam

(10) Patent No.: US 6,269,115 B1
(45) Date of Patent: Jul. 31, 2001

(54) LINEAR-PHASE FILTER IMPLEMENTATION USING ORTHONORMAL LAGUERRE EXPANSIONS

(75) Inventor: Giridhar D. Mandyam, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/110,531

(22) Filed: Jul. 6, 1998

Related U.S. Application Data

(60) Provisional application No. 60/054,776, filed on Aug. 5, 1997.

(51) Int. Cl.[7] .............................. H03H 7/30; H03H 7/40; H03K 5/159
(52) U.S. Cl. .......................................... 375/229; 708/300
(58) Field of Search .................................... 375/229, 230, 375/232, 233, 343, 261, 152, 350; 708/300, 314, 323; 377/77; 333/18, 28 R

(56) References Cited

U.S. PATENT DOCUMENTS

| | | | |
|---|---|---|---|
| 4,251,886 | * 2/1981 | Tomlinson et al. | 375/261 |
| 4,961,206 | * 10/1990 | Tomlinson et al. | 375/261 |
| 5,031,194 | * 7/1991 | Crespo et al. | 375/233 |
| 5,663,983 | * 9/1997 | Lin | 375/152 |

* cited by examiner

Primary Examiner—Chi Pham
Assistant Examiner—Jean B. Corrielus
(74) Attorney, Agent, or Firm—J. Dennis Moore; W. James Brady, III; Frederick J. Telecky, Jr.

(57) ABSTRACT

A forward impulse response, linear-phase matched filter, receiving as an input a sampled digital representation of an input signal, x(n), having n samples, and providing a filtered output, $y_a(n)$, having K stages, stage 0, stage 1, ... stage k, ... stage K-2, stage K-1. The implementation of the filter includes a block in stage 0 for multiplying the values x(n) by the value $$\frac{\sqrt{1-b^2}}{1-bz^{-1}}$$

to generate values $v_0(n)$. Blocks are provided in stages 1 though K-1 for generating the values $v_k(n)$ for k=1→K-1, where $v_k(n) = bv_k(n-1) + v_{k-1}(n-1) - bv_k(n)$. Further blocks are provided in stages 0 through K-1 for multiplying $v_k(n)$ by a respective constant value, $c_k$, for generating a series of intermediate values $i_k$. A final block sums the intermediate values to produce said filtered output, $y_a(n)$. In the implementation the value b is a Laguerre parameter, and the value z is a z-transform of the filter behavior. A predetermined limiting function is applied in determining the value $v_k(n)$ to reduce the number of multiplications necessary to implement the filter function, while avoiding instabilities in the filter so implemented. Discrete-time Laguerre sequences are effective for representing sequences in the form of orthogonal expansions. Taking advantage of the network realization of a Laguerre expansion, it is shown that approximating linear-phase matched filters by means of Laguerre expansion provides considerable savings in hardware implementations without adding significant distortion.

1 Claim, 3 Drawing Sheets

LINEAR-PHASE FILTER IMPLEMENTATION USING ORTHONORMAL LAGUERRE EXPANSIONS

This amendment claims priority under 35 U.S.C. § 119(e)(1) of provisional application No. 60/054,776 filed Aug. 5, 1997.

FIELD OF THE INVENTION

The present invention relates to digital communications, and more particularly relates to digital filtering of signals used in such communications, specifically, FIR linear-phase matched filters.

BACKGROUND OF THE INVENTION

Forward impulse response "FIR" digital filters are, in general, well known in the art of digital communications. FIR linear-phase matched filters are desirable in such art. FIR linear-phase matched filters can be designed to have both constant phase delay and constant group delay, which results in excellent distortion characteristics of such filters.

However, the design of FIR linear-phase matched filters to meet specific performance objectives is generally more difficult than the design of infinite impulse response filters for similar applications. In addition, such FIR filters implemented with recursive techniques can be subject to instability problems, such as limit-cycle oscillations.

Thus, it would be desirable to have a filter, and a design technique for such a filter, which is relatively simple, and which will approximate FIR linear-phase matched filters with little degradation in performance and freedom from distortion, while still providing significant savings in hardware.

SUMMARY OF THE INVENTION

According to the present invention, there is provided a forward impulse response, linear-phase matched filter, receiving as an input a sampled digital representation of an input signal, x(n), having n samples, and providing a filtered output, $y_a(n)$, having K stages, stage 0, stage 1, ... stage k ... stage K-2, stage K-1. The implementation of the filter includes a block in stage 0 for multiplying the values x(n) by the value $$\frac{\sqrt{1-b^2}}{1-bz^{-1}}$$

to generate values $v_0(n)$. Blocks are provided in stages 1 through K-1 for generating the values $v_k(n)$ for k=1→K-1, where $v_k(n)=bv_k(n-1)+v_{k-1}(n-1)-bv_k(n)$. Alternately, $v_k(n)=v_{k-1}(n-1)(z^{-1}-b)/(1-bz^{-1})$, expressed in terms of z-transform. Further blocks are provided in stages 0 through K-1 for multiplying $v_k(n)$ by a respective constant value, $c_k$, for generating a series of intermediate values $i_k$. A final block sums the intermediate values to produce said filtered output, $y_a(n)$. In the implementation the value b is a Laguerre parameter, and the value z is a z-transform of the filter behavior. A predetermined limiting function is applied in determining the value $v_k(n)$ to reduce the number of multiplications necessary to implement the filter function, while avoiding instabilities in the filter so implemented Discrete-time Laguerre sequences are effective for representing sequences in the form of orthogonal expansions. Taking advantage of the network realization of a Laguerre expansion, it is shown that approximating linear-phase matched filters by means of Laguerre expansion provides considerable savings in hardware implementations without adding significant distortion.

These and other features of the invention will be apparent to those skilled in the art from the following detailed description of the invention, taken together with the accompanying drawings.

DETAILED DESCRIPTION OF THE PREFERRED EMBODIMENTS

Discrete orthogonal Laguerre expansions are known in the electronics arts. For example, see Arnold, C. R., "Laguerre Functions and the Laguerre Network—Their Properties and Digital Simulation." Massachusetts Institute of Technology, Lincoln Laboratory, Technical Note, 1966–28, May, 1988. Such expansions have found applications in areas such as electromagnetic pulse compression and filtering, and speech coding. For example, see Mandyam. Giridhar. Nasir Ahmed and Bruce Armstrong, "Electromagnetic Pulse Signal Representation Using Orthonormal Laguerre Sequences," *IEEE Transactions on Electromagnetic Compatibility*, Vol. 37, No. 4, pp. 592–595, November, 1995, and "Al-Jabri, A. and S. A. Alshbelli, "Laguerre Transform for Speech Compression," *IEEE Instrumentation and Measurement Technology Conference*, Hamamatsu, Japan, 1994.

I have discovered a technique, using the Laguerre expansion, for filter implementation which will approximate FIR linear-phase matched filters with little degradation in performance and still provide significant savings in hardware. The preferred embodiments of this technique will now be described.

The Laguerre expansion of a discrete sequence can be represented as a network, which can lead to an efficient hardware implementation. The Laguerre expansion involves the well-known z-transform, hence the also well-known complex number value z that appears in the expressions that follow. Given a sequence y(n), its Laguerre expansion is defined as:

$$y(n) = \sum_{k=0}^{\infty} c_k(b) l_k(n, b) \qquad (1)$$

where 0<b<1, $c_k$ is the k-th Laguerre coefficient, and $l_k$(n, b) is a Laguerre sequence given by:

$$l_k(n, b) = Z^{-1}\left\{\sqrt{1-b^2}\frac{(z^{-1}-b)^k}{(1-bz^{-1})^{k+1}}\right\}, 0 < b < 1 \quad (2)$$

The parameter b is also called the Laguerre parameter. It can be varied between 0 and 1 so as to better represent y(n). Since Laguerre sequences $l_k(n,b)$ are orthonormal, it follows that the coefficients $c_k$ can be evaluated using the relation:

$$c_k = \sum_{n=0}^{\infty} y(n)l_k(n, b) \quad (3)$$

To approximate y(n), I evaluate a finite number of Laguerre coefficients $c_k$. If the number of coefficients is L+1, then there is an L-stage expansion.

Figure 1:
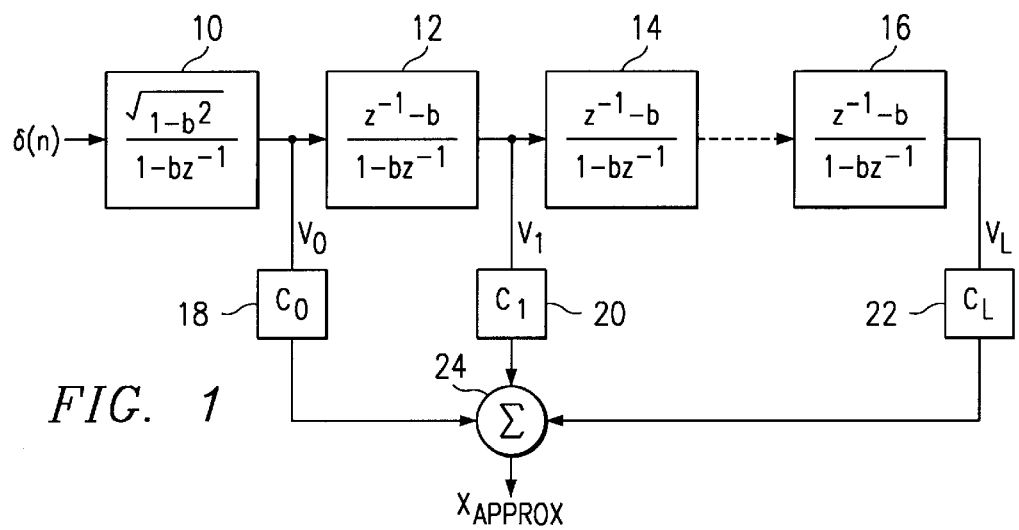
FIG. 1 is a schematic representation of a Laguerre filter in accordance with the preferred embodiment of the present invention.

The approximation problem becomes easier in the case of finite-length sequences. If y(n) is of finite length N+1, then an appropriate L must be determined to achieve an acceptable signal reconstruction $y_a(n)$; unfortunately, there are no analytic methods to accomplish this. However, if the Laguerre expansion is viewed in terms of an FIR filter, then one needs to simply feed an impulse sequence x(n) to this filter to obtain $y_a(n)$ at the output, as illustrated in FIG. 1, which shows a schematic representation of this Laguerre expansion. Note that for this FIR filter, the series n represents a series of samples of digitized signal, which is the case in practical application of the principles of the present invention.

As can be seen, the impulse sequence x(n) is provided to the input of a first computational block 10. The output of block 10, $v_0$ (explained below), is provided to the input of a second computational block 12, and to a step 18 of multiplication by $c_0$. The output of block 12, v(explained below), is provided to the input of a third computational block 14, and to a step 20 of multiplication by $c_1$, and so forth. Finally, the output of block 16, $v_L$ (explained below), is provided to a step 22 of multiplication by $c_L$. The output of steps 18, 20, . . . 22, are provided to the input of a summation step 24. The output of summation step 24 is the value $y_a(n)$.

The representation in FIG. 1 leads to an efficient means of realizing the expansion in software or hardware. In this way, if y(n) represents an FIR filter, then $y_a(n)$ models the impulse response of this filter. The output of the first-order ARMA (ARMA stands for "Autoregressive Moving Average," and is a well-known technique in this art) processes $\{v_k\}$ in the delay line in FIG. 1 can also be calculated using the recursive relationship:

$$v_0(n) = bv_0(n-1) + \sqrt{1-b^2}x(n) \quad (4)$$

$$v_{k+1}(n) = bv_{k+1}(n-1) + v_k(n-1) - bv_k(n) \quad (5)$$

Yet another problem arises with finding an optimal value for b. Noting that $y_a(n)$ is defined as:

$$y_a(n) = \sum_{k=0}^{L} c_k(b)l_k(n, b) \quad (6)$$

the corresponding squared error is:

$$\varepsilon(b) = \sum_{n=0}^{\infty} (x(n) - y_a(n))^2 \quad (7)$$

Since the basis sequences are orthonormal, Equation (7) simplifies to:

$$\varepsilon(b) = \sum_{n=0}^{\infty} x(n)^2 - \sum_{k=0}^{L} c_k(b)^2 \quad (8)$$

Thus an optimal value of b can be found by differentiating Equation (8) with respect to b, and setting the resulting expression equal to zero; this leads to:

$$\sum_{k=0}^{L} c_k(b)\frac{d}{db}c_k(b) = 0 \quad (9)$$

Equation (9) simplifies to yield:

$$\sum_{k=0}^{L} c_k(b)\frac{d}{db}c_k(b) = \frac{L+1}{1-b^2}c_L(b)c_{L+1}(b), 0 < b < 1 \quad (10)$$

Since the coefficients $c_k$ can be represented as polynomials of b, it is necessary to find the roots of Equation (10), and for those roots, find the root for which the squared error in Equation (8) is a minimum. To that end, first the $c_k(b)$ coefficients are found.

Knowing the Z-transform relationships of x(n) and $l_k(n, b)$, it can be seen that:

$$c_k(b) = \frac{1}{2\pi j}\oint_C X(z)L_k(z^{-1}, b)z^{-1}dz \quad (11)$$

where C encloses all the poles of X(z). Equation (11) can be evaluated and expressed in closed-form as:

$$c_k(b) = \sqrt{1-b^2}\sum_{i=0}^{N}\sum_{s=0}^{\min(i,k)}(-1)^{k-s}\begin{bmatrix}i\\s\end{bmatrix}\begin{bmatrix}k-s+i\\i\end{bmatrix}x(i)b^{i+k-2s} \quad (12)$$

Thus in this manner, all the coefficients $c_k(b)$ can be solved up to the Lth coefficient, In practice, the process of finding the roots of polynomials of arbitrary order and then determining which root minimizes the error is computationally expensive. I have discovered that I can assign a constant value to b such that stability of the filter is preserved. Such constant value for b is between 0 and 1.

Although the realization in FIG. 1 looks like an FIR filter implementation, the delay line for Laguerre expansions is not as simple as the standard tap-delay line of FIR filters. The delay line can be thought of as a tap-delay line whose delay elements have been replaced by first-order ARMA processes. Therefore, even if an N tap FIR filter is replaced by an L-stage Laguerre expansion (L<N), the number of multiplications may still be the same if not more due to the b coefficient multiplications in each of these ARMA processes. This involves and unacceptably high number of multiplications for any practical implementation, for example in the digital communications arts.

However, applying the key simplification I have discovered, mentioned above, provides a tremendous reduction in the number of multiplications that must bee performed in order to implement this process. Thus, if b is equal to 0.5, for example, the digital hardware realization of a Laguerre expansion simplifies considerably, as a multiplication by 0.5 is simply a binary shift. This is easier to implement digitally than a full multiply operation.

Figure 2:
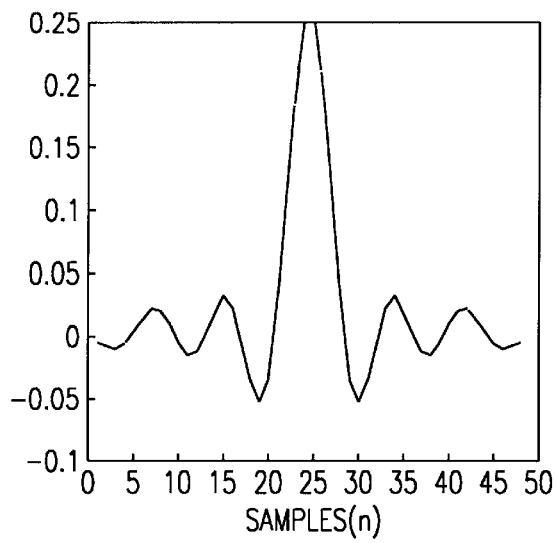
FIG. 2 is a diagram of the behavior of a linear-phase matched filter given in the IS-95-A spread spectrum mobile communications standard.
Figure 3:
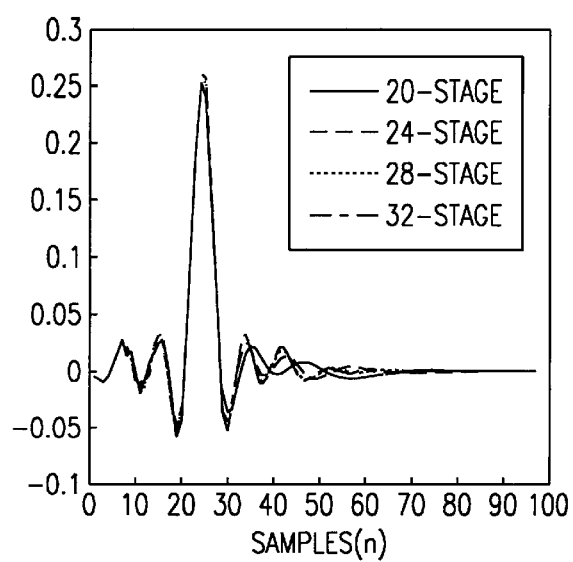
FIG. 3 is a diagram of the Laguerre reconstructions for several approximations in accordance with the preferred embodiment of the present invention.
Figure 4:
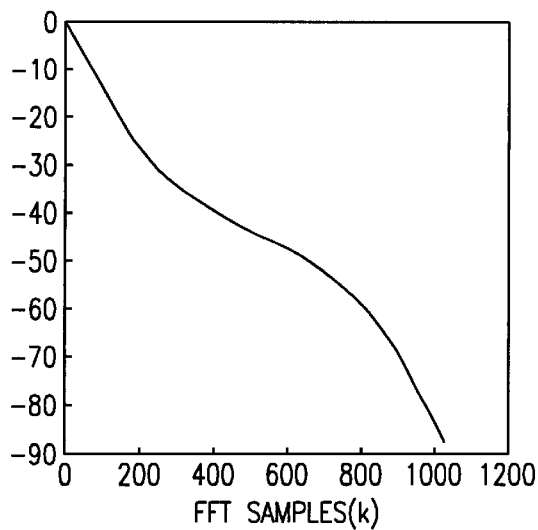
FIGS. 4–9 depict further electrical characteristics of the Laguerre Filter in accordance with the preferred embodiment of the present invention shown in FIG. 1, depicting the behavior of the filter as a function of the number of samples.
Figure 5:
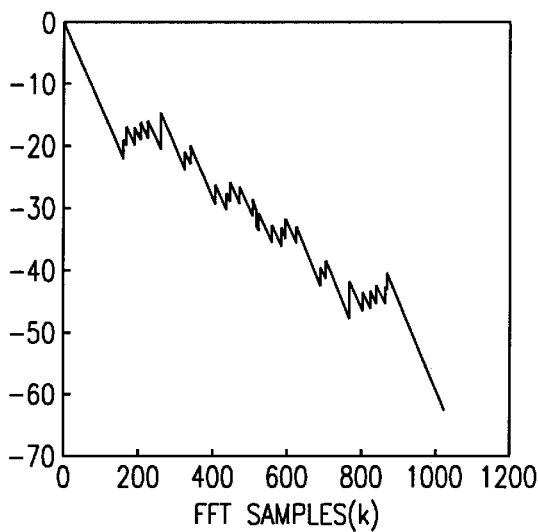
Figure 6:
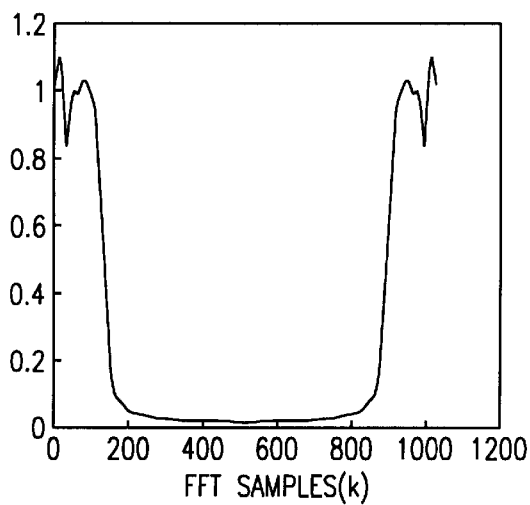
Figure 7:
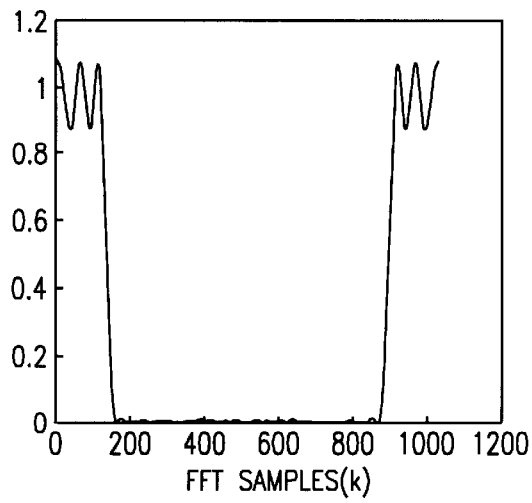
Figure 8:
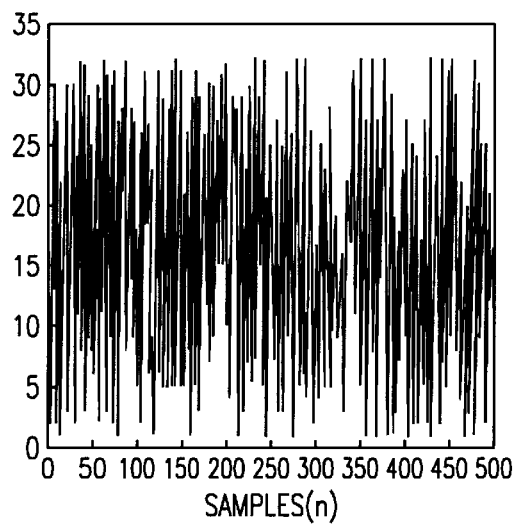
Figure 9:
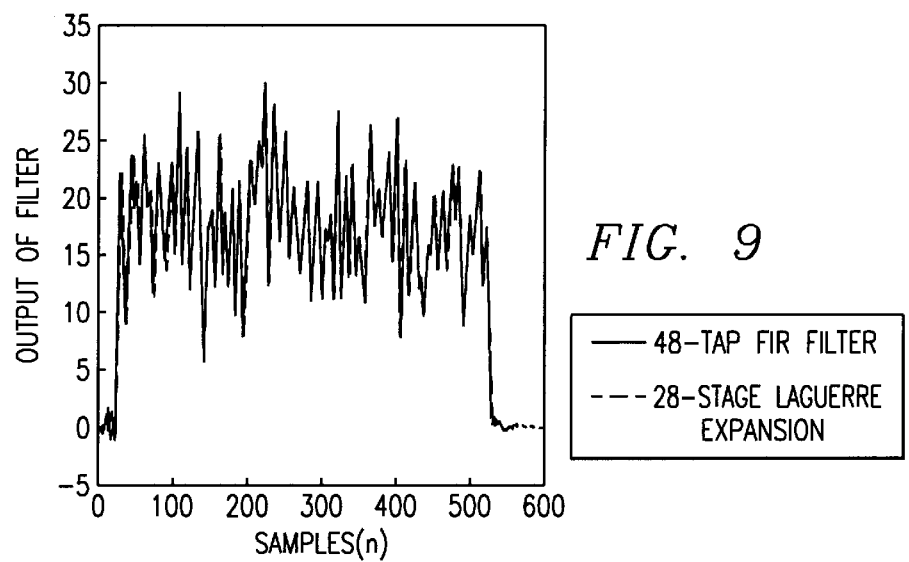

The calculation of the $c_k(b)$ coefficients is straightforward once b has been determined: each Laguerre coefficient is a linear combination of a subset of the original data sequence. As an example, the linear-phase matched filter given in IS-95-A spread spectrum mobile communications standard is considered. This filter, the behavior of which (y-axis= amplitude; x-axis=samples) is pictured in FIG. 2, has a tap spacing of one-quarter chip (chipping frequency being 1.2288 MHz). The Laguerre reconstructions are shown for several approximations in FIG. 3; the corresponding impulse response mean-squared error is shown in Table 1 (the variance of the FIR filter coefficients is 0.0047). The impulse responses are shown for longer than 48 samples so as to demonstrate the presence of zero-input limit cycles; evidently, this filter structure eliminates such effects. Although the Laguerre approximation exhibits phase distortion, the phase distortion is primarily in the stopband and is attenuated by the magnitude response. The Laguerre expansion cannot duplicate the linear phase characteristic of the original FIR filter exactly; nevertheless, it comes very close.

Although the number of multiplies seems to have been reduced by simply adjusting the value of b, the outputs of each of the ARMA elements $\{v_k\}$ in the delay line of FIG. 1 may still require increasing precision, this may erase any computational gains from reducing the number of coefficient multiplies. Restricting the amount of precision used in quantizing these ARMA process outputs depends largely on restricting the amount of precision utilized for the input signal. Assume that the incoming data to the filter is quantized to B bits; therefore the incoming discrete signal has $2^B$ possible values. If it is assumed that $2^B$ is the absolute maximum value for any discrete signal in the input sequence, the values for $\{v_k\}$ may be finitely-quantized. I will now demonstrate how, the range of quantization is determined. This is accomplished by finding lease-upper bounds for the magnitudes of $\{v_k\}$.

A bound on $v_0$ may be found in the following manner: first assume that a supremum (a "supremum" is the least upper bound of a set of elements, and is a well known term in this art) of $|v_0|$ exists, denoted by $K_0$, and that the input sequence $x(n)$ satisfies $0<x(n)\leq 2^B$ (this condition can be changed to reflect an arbitrary magnitude bound on the input sequence very easily). Then referring to Equation (4), an absolute bound may be constructed:

$$|v_0(n)|=|bv_0(n-1)+\sqrt{1-b^2}x(n)| \quad (13)$$

$$<b|v_0(n-1)|+\sqrt{1-b^2}2^B \quad (14)$$

Since $K_0$ is the supremum of $|v_0|$, then it is possible to conclude:

$$K_0 \leq b|v_0(n-1)| + \sqrt{1-b^2}\, 2^B \quad (15)$$

$$\leq bK_0 + \sqrt{1-b^2}\, 2^B \quad (16)$$

and therefore:

$$K_0 \leq \frac{\sqrt{1-b^2}\, 2^B}{1-b} \quad (17)$$

Thus $K_0$ is finite for any $0<b<1$.

Similarly, a bound on $v_1$ can be found:

$$|v_1(n)| = |bv_1(n-1) + v_0(n-1) - bv_0(n)| \quad (18)$$

$$\leq |bv_1(n-1)| + |v_0(n-1) - bv_0(n)| \quad (19)$$

Recalling that the supremum of $v_1$ is $K_1$ and the relationship for $v_0(n)$ in Equation (4), then this inequality may be expressed as:

$$|v_1(n)|\leq bK_1+|v_0(n-1)-b(bv_0(n-1)+\sqrt{1-b^2}x(n))| \quad (20)$$

With some simplification, this bound becomes:

$$|v_1(n)|\leq bK_1+|(1-b^2)v_0(n-1)-b\sqrt{1-b^2}x(n))| \quad (21)$$

The fundamental assumption on the input range of the data sequence $x(n)(0<x(n)\leq 2^B)$ results in $v_0(n)$ never being negative. Therefore, the largest value that the $|(1-b^2)v_0(n-1)-b\sqrt{1-b^2}x(n)|$ term in Equation (21) can attain is $(1-b^2)K_0-b\sqrt{1-b^2}$. Therefore, the bound for $v_1$ becomes:

$$|v_1(n)|\leq bK_1+(1-b^2)K_0-b\sqrt{1-b^2} \quad (22)$$

which results in:

$$K_1 \leq \frac{(1-b^2)K_0 - b\sqrt{1-b^2}}{1-b} \quad (23)$$

$$\leq \frac{(2^B + b2^B - b)\sqrt{1-b^2}}{1-b} \quad (24)$$

Therefore $K_1$ is also finite for $0<b<1$.

A general bound on $v_{k+1}$, $k\geq 0$ may be found as well:

$$|v_{k+1}(n)| = |bv_{k+1}(n-1) + v_k(n-1) - bv_k(n)| \quad (25)$$

$$\leq b|v_{k+1}(n-1)| + |v_k(n-1) - bv_k(n)| \quad (26)$$

Recalling that the supremum of $v_{k+1}$ is $K_{k+1}$, then:

$$|v_{k+1}(n)|\leq bK_{k+1}+|v_k(n-1)-bv_k(n)| \quad (27)$$

Finally, this bound may be expressed as:

$$|v_{k+1}(n)|\leq bK_{k+1}+|v_k(n-1)|-b|v_k(n)| \quad (28)$$

Therefore $K_{k+1}$ is found as $$K_{k+1} \leq \frac{1+b}{1-b} K_k \quad (29)$$

Thus if $K_k$ is finite, so is $K_{k+1}$. Since $K_0$ is finite, then for finite k, the bound for $v_k$ is also finite.

Although this establishes a maximum range for $\{v_k\}$, these bounds increase arbitrarily as the number of stages in the Laguerre expansion increases. Therefore, I am interested in a "working" bound The bound on $v_0$ is manageable, as it is not much larger than the maximum value for the input sequence. However, the bound on $v_1$ derived in Equation (23) results in a significant increase of the bound on $v_0$ if b=0.5. If the range of quantization required for $v_1$ based on this bound is determined, then the range necessary to quantize $v_1$ will be greater than for $v_0$. This problem becomes more severe for increasing values of k. However, making certain assumptions about the input sequence may result in simplifying these bounds. First, the bound of Equation (27) is revisited:

$$|v_{k+1}(n)|=bK_{k+1}+|v_k(n-1)-bv_k(n)|$$

By dividing out $v_k(n-1)$ from the second term on the right side of the equation, the following bound is derived:

$$|v_{k+1}(n)| \leq bK_{k+1} + K_k \left|1 - b\frac{v_k(n)}{v_k(n-1)}\right| \quad (30)$$

One would like to simplify the ratio $v_k(n)/v_k(n-1)$; in fact, if this ratio can be shown to be unity, then Equation (30) becomes $$|v_{k+1}(n)| \leq bK_{k+1} + K_k(1-b) \quad (31)$$

which results in $$K_{k+1} < K_k \quad (32)$$

which implies that $K_0$ is the sufficient bound for all $\{v_k\}$. A starting assumption is that the input sequence to each ARMA process does not change rapidly, i.e. $x(n) \approx x(n-1) \approx x(n-3) \approx \ldots \approx x(n-D), n=D, 2D, 3D, \ldots$ for some $D>1$. Another assumption is that b is chosen such that $b^N = 0, N \ll D$. Then a demonstration by induction is possible (the reason this exercise is referred to as a demonstration rather than a proof is due to the fact that the ratio $$\frac{v_k(n)}{v_k(n-1)} \approx 1$$

will be shown to hold most of the time): Zeroth Case: Assuming $\{v_0(n)\}$ is equal to zero prior to initial input excitation, which will be assumed to occur at n=0, then $$v_0(0) = \sqrt{1-b^2}\, x(0) \quad (33)$$

$$v_0(1) = bv_0(0) + \sqrt{1-b^2}\, x(1) \quad (34)$$

$$= b\sqrt{1b-b^2}\, x(0) + \sqrt{1-b^2}\, x(1) \quad (35)$$

$$v_0(2) = b^2\sqrt{1-b^2}\, x(0) + b\sqrt{1-b^2}\, x(1) + \sqrt{1-b^2}\, x(2) \quad (36)$$

$$\vdots \quad (37)$$

$$v_0(N) = b^N \sqrt{1-b^2}\, x(0) + b^{N-1}\sqrt{1-b^2}\, x(1) + \ldots + \sqrt{1-b^2}\, x(N) \quad (38)$$

$$= b^{N-1}\sqrt{1-b^2}\, x(1) + \ldots + \sqrt{1-b^2}\, x(N) \quad (39)$$

$$= b^{N-1}\sqrt{1-b^2}\, x(0) + \ldots + \sqrt{1-b^2}\, x(N-1) \quad (40)$$

$$= v_0(N-1) \quad (41)$$

Therefore, after N data values, the ratio $$\frac{v_0(n)}{v_k(n-1)}$$

becomes unity. As soon as the next D repetitions in the input data sequence are processed, then it will take another N input data points for the unity ratio to hold. However, since $K \gg N$ it can be seen that $v_0(n)$ is constant for $D_0 = D - N$ samples, much longer than N samples of each input sequence repetition interval of length D. Therefore $v_0$ is constant most of the time. General Case: Assuming that $$\frac{v_k(n)}{v_k(n-1)}$$

is unity and the number of consecutive samples for which $v_k$ is constant is $D_k(D_k \gg N)$, it is desired to demonstrate that $$\frac{v_{k+1}(n)}{v_{k+1}(n-1)}$$

is unity as well (although $v_k$ is not constant for $D_k$ bursts at all times, this assumption will suffice most of the time). Starting from Equation (5):

$$v_{k+1}(n) = bv_{k+1}(n-1) + v_k(n-1) - bv_k(n)$$

It can be shown that $$v_{k+1}(n) = bv_{k+1}(n-1) + v_k(n-1)\left(1 - b\frac{v_k(n)}{v_k(n-1)}\right) \quad (42)$$

$$= bv_{k+1}(n-1) + v_k(n-1)(1-b) \quad (43)$$

Under the assumptions that $x(n)=0$ for $n<0$, $v^*(n)$ is of the same value for $D_k$ consecutive samples, and knowing that due to propagation of the input sequence through the delay line, then it can be seen that $$v_{k+1}(0) \quad = 0 \quad (44)$$

$$\vdots \quad (45)$$

$$v_{k+1}(k+1) \quad = v_k(k)(1-b) \quad (46)$$

$$v_{k+1}(k+2) \quad = bv_{k+1}(k+1) + v_{k+1}(k+1)(1-b) \quad (47)$$

$$\quad = bv_k(k)(1-b) + v_{k+1}(k+1)(1-b) \quad (48)$$

$$v_{k+1}(k+1+N) = b^N(1-b)v_k(0) + \ldots + (1-b)v_k(N) \quad (49)$$

$$= b^{N-1}(1-b)v_k(1) + \ldots + (1-b)v_k(N-1) \quad (50)$$

$$= v_k(k+N) \quad (51)$$

Therefore, after k+N values, $$\frac{v_{k+1}(n)}{v_{k+1}(n-1)}$$

becomes unity most of the time.

Since I made many assumptions in establishing that $K_0$ is a good working bound, I have added some margin to account for values outside the range defined by $K_0$.

Assuming the case of 5-bit input quantization, then the range of input levels can be said to be greater than or equal to 1 but less than or equal to 32 (i.e. $2^B$). If the Laguerre parameter b is 0.5, then $K_0$ is bounded by 55.42562584. For an L-stage Laguerre expansion, the number of full coefficient multiplies per output is L+2 in this case, where the $\sqrt{1-b^2}$ multiplication in the first element of the delay line is counted as a coefficient imultiply. The rest of the multiplications are simply binary shifts.

As an example, the 48-tap FIR implementation of the matched filter used in IS-95-A was examined with actual simulated random integer data ranging from 1 up to but not including 33. Note that since this data was not occurring in repetitions and was totally random, this constituted a severe test case for quantization with respect to the $K_0$ bound rather than the general $K_k$ bound. The same data was passed through a Laguerre expansion with 28 stages. Two further simplifications to the Laguerre expansion were accomplished by (1) truncating the $\sqrt{1-b^2}=\sqrt{3/4}$ factor to 0.866, and (2) quantizing the $\{v_k\}$ outputs to 32 levels ranging from −64 to 64 in steps of four (this range is needed for the margin necessary to account for values outside the $K_0$ range). The responses of the two filters were in near agreement. Moreover, the response of the Laguerre approximation died down quickly upon zero-excitation, implying that zero-input limit cycles are not a problem for this realization. It must be noted that neither the Laguerre $\{c_k\}$ coefficients nor the FIR coefficients were quantized for these simulations.

Thus, I have discovered a method by which Laguerre expansions have been used to effectively model linear phase FIR filters I have derived practical bounds on relevant internal quantization which has simplified the number of multiplications necessary for implementation. Implementation in software is straightforward, and well within the purview of those of ordinary skill in the art area to which the present invention pertains having the benefit of the understanding of the principles of the invention as set forth herein. Implementation in hardware is similarly straightforward, and can be accomplished by inputting the algorithms of the embodiment set forth herein into a conventional circuit design tool.

Although the present invention and its advantages have been described in detail, it should be understood that various changes, substitutions and alterations can be made herein without departing from the spirit and scope of the invention as defined by the appended claims.

What is claimed is:

1. A forward impulse response, linear-phase matched filter, receiving as an input a sampled digital representation of an input signal, $x(n)$, having n samples, and providing a filtered output, $y_a(n)$, having K stages, stage 0, stage 1, ... stage k, ... stage K−2, stage K−1, comprising:

means in stage 0 for multiplying the values $x(n)$ by the value $$\frac{\sqrt{1-b^2}}{1-bz^{-1}}$$

to generate values $v_0(n)$;

means in stages 1 though K−1 for generating the values $v_k(n)$ for k=1→K−1, where
$v_k(n)=v_{k-1}(n-1)(z^{-1}-b)/(1-bz^{-1})$;

means in stages 0 through K−1 for multiplying $v_k(n)$ by a respective constant value, $c_k$; for generating a series of intermediate values $i_k$; and means for summing said intermediate values to produce said filtered output, $y_a(n)$; wherein the value b is a Laguerre parameter, the value z is a z-transform of the filter behavior, a predetermined limiting function is applied in determining the value $v_k(n)$ to reduce the number of multiplications necessary to implement the filter function, while avoiding instabilities in the filter so implemented.

\* \* \* \* \*